(12) United States Patent
Chu et al.

(10) Patent No.: US 7,902,752 B2
(45) Date of Patent: Mar. 8, 2011

(54) ORGANIC LIGHT-EMITTING SUBSTRATE, METHOD FOR MANUFACTURING THE SAME, AND ORGANIC LIGHT-EMITTING DISPLAY APPARATUS HAVING THE SAME

(75) Inventors: Chang-Woong Chu, Suwon-si (KR); Jin-Koo Chung, Suwon-si (KR); Chang-Mo Park, Seoul (KR); Seong-Min Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 138 days.

(21) Appl. No.: 12/356,894

(22) Filed: Jan. 21, 2009

(65) Prior Publication Data
US 2009/0243470 A1 Oct. 1, 2009

(51) Int. Cl.
*H01J 1/62* (2006.01)
(52) U.S. Cl. .......................... 313/506; 313/504
(58) Field of Classification Search .................. 313/498, 313/504, 506
See application file for complete search history.

(56) References Cited

U.S. PATENT DOCUMENTS
2007/0120473 A1* 5/2007 Nakamura et al. ............ 313/506

* cited by examiner

*Primary Examiner* — Vip Patel
(74) *Attorney, Agent, or Firm* — Cantor Colburn LLP

(57) ABSTRACT

An organic light-emitting substrate includes; a base substrate including a display area and a peripheral area formed around the display area, an organic light-emitting diode including a pixel electrode, a common electrode and an organic light-emitting part, the pixel electrode being formed in a unit pixel of the display area, the common electrode being formed over the display area, and the organic light-emitting part being disposed between the pixel electrode and the common electrode, a driving circuit part which applies driving current to the pixel electrode and is electrically connected to the pixel electrode, and a common voltage subsidiary line formed on substantially the same layer as the pixel electrode, spaced apart from the pixel electrode, disposed under the common electrode, and electrically connected to the common electrode.

15 Claims, 14 Drawing Sheets

ORGANIC LIGHT-EMITTING SUBSTRATE, METHOD FOR MANUFACTURING THE SAME, AND ORGANIC LIGHT-EMITTING DISPLAY APPARATUS HAVING THE SAME

This application claims priority to Korean Patent Application No. 2008-29217, filed on Mar. 28, 2008, and all the benefits accruing therefrom under 35 U.S.C. §119, the contents of which in its entirety are herein incorporated by reference.

BACKGROUND OF THE INVENTION

1. Field of the Invention

Exemplary embodiments of the present invention relate to an organic light-emitting substrate, a method for manufacturing the organic light-emitting substrate, and an organic light-emitting display apparatus having the organic light-emitting substrate. More particularly, the present invention relates to an organic light-emitting substrate having a common electrode to which a common voltage is applied, a method for manufacturing the organic light-emitting substrate, and an organic light-emitting display apparatus having the organic light-emitting substrate.

2. Description of the Related Art

Generally, an organic light-emitting display apparatus includes an organic light-emitting substrate emitting light, an opposite substrate facing the organic light-emitting substrate, and a sealing member enclosing a gap between the organic light-emitting substrate and the opposite substrate.

The organic light-emitting substrate includes a base substrate, an organic light-emitting diode ("OLED") formed on the base substrate, and a driving circuit part electrically connected to the OLED to provide driving current to the OLED.

The OLED typically includes a common electrode, a pixel electrode and an organic light-emitting part. The common electrode is formed over the base substrate. The pixel electrode is formed in a unit pixel, and a light-emitting display apparatus typically includes a plurality of individual unit pixels disposed in a matrix-shape. The organic light-emitting part is disposed between the common electrode and the pixel electrode and emits light according to a current passing therethrough. The common electrode is electrically connected to a common electrode line formed around the base substrate so as to receive a common voltage applied from the common electrode applying line.

The organic light-emitting substrate may be classified as either a top emission type organic light-emitting substrate or a bottom emission type organic light-emitting substrate. In the top emission type organic light-emitting substrate, the light is emitted towards an upper portion of the base substrate. In the bottom emission type organic light-emitting substrate, the light is emitted towards a lower portion of the base substrate. For example, the top emission type organic light-emitting substrate includes an OLED having a transparent common electrode and an opaque pixel electrode.

In this case, the common electrode has a relatively thin thickness in order to retain transparency, as a result of which the common electrode may have a relatively high resistance. The resistance of the common electrode changes the common voltage transferred through the common electrode according to a position, so that the organic light-emitting display apparatus may display an image having image defects, such as spots.

BRIEF SUMMARY OF THE INVENTION

Exemplary embodiments of the present invention provide an organic light-emitting substrate capable of improving display quality that is decreased due to a resistance of a common electrode.

Exemplary embodiments of the present invention also provide a method for manufacturing the organic light-emitting substrate.

Exemplary embodiments of the present invention also provide an organic light-emitting display apparatus having the organic light-emitting substrate.

In one exemplary embodiment of an organic light-emitting substrate according to the present invention, the organic light-emitting substrate includes; a base substrate including a display area and a peripheral area formed around the display area, an organic light-emitting diode including a pixel electrode, a common electrode and an organic light-emitting part, the pixel electrode being formed in a unit pixel of the display area, the common electrode being formed over the display area, and the organic light-emitting part being disposed between the pixel electrode and the common electrode, the driving circuit part electrically connected to the pixel electrode, the driving circuit part being configured to apply a driving current to the pixel electrode, and a common voltage subsidiary line formed on substantially the same layer as the pixel electrode, spaced apart from the pixel electrode, disposed under the common electrode, and electrically connected to the common electrode In one exemplary embodiment, the common voltage subsidiary line may enclose an outline of a unit block, and the unit block may include a plurality of unit pixels. In one exemplary embodiment, the organic light-emitting part may be formed across the plurality of unit pixels. In one exemplary embodiment, the organic light-emitting part may include a plurality of organic light emitting parts, each of the plurality of light-emitting parts having a rectangular shape that has a first edge having a first length and a second edge having a second length, and wherein the first and second lengths may be respectively in a range from about 5 cm to about 25 cm, and a distance between adjacent organic light-emitting parts may be in a range from about 0.4 mm to about 0.6 mm.

In one exemplary embodiment, the organic light-emitting substrate may further include a light-blocking pattern formed along an outline of the unit pixel and configured to block light emitted by the light-emitting diode. In one exemplary embodiment, the light-blocking pattern may include a contact hole formed between the common electrode and the common voltage subsidiary line, wherein the common voltage subsidiary line and the common electrode are electrically connected therethrough.

In one exemplary embodiment, the organic light-emitting substrate may further include a common voltage outer line disposed in the peripheral area and electrically connected to the common voltage subsidiary line, wherein the common voltage outer line is configured to apply a common voltage to the common voltage subsidiary line.

In one exemplary embodiment, the organic light-emitting substrate may further include a protective layer formed on the base substrate covering the driving circuit part and wherein the OLED may be formed on the protective layer and may be electrically connected to the driving circuit part through a pixel contact hole formed through the protective layer. In one exemplary embodiment, the common voltage outer line may be formed between the protective layer and the base substrate, and the common voltage subsidiary line may be formed on the protective layer and may be electrically connected to the common voltage outer line through an outer line contact hole formed through the protective layer. In one exemplary embodiment, the common electrode may include a transparent conductive material, and the pixel electrode may include a reflective electrode configured to reflect light emitted by the organic light-emitting part.

In one exemplary embodiment, the organic light-emitting part may be configured to emit white light. In one exemplary embodiment, the organic light-emitting part may include a red light-emitting material configured to emit red light, a green light-emitting material configured to emit green light, and a blue light-emitting material configured to emit blue light.

An exemplary embodiment of a method for manufacturing the organic light-emitting substrate according to the present invention includes; forming a driving circuit part on a base substrate, and the base substrate has a display area and a peripheral area formed around the display area, forming a pixel electrode and a common voltage subsidiary line in the display area, the pixel electrode being electrically connected to the driving circuit part, and the common voltage subsidiary line is spaced apart from the pixel electrode, forming an organic light-emitting part on the pixel electrode, forming a common electrode on the organic light-emitting part, the common electrode being electrically connected to the common voltage subsidiary line.

In one exemplary embodiment, the organic light-emitting part may be deposited on the pixel electrode through a shadow mask. In such an exemplary embodiment, the organic light-emitting part may be formed on the pixel electrode by: aligning a blocking area of the shadow mask with the common voltage subsidiary line, and transmitting an organic light-emitting deposition material through an opening area of the shadow mask.

In one exemplary embodiment, the common voltage subsidiary line may be configured to enclose an outline of a plurality of pixel electrodes, and the organic light-emitting part may be formed across the plurality of pixel electrodes.

In one exemplary embodiment, the opening area of the shadow mask may include a rectangular shape that has a first edge having a first length and a second edge having a second length, and wherein the first and second lengths may be respectively in a range from about 5 cm to about 25 cm, and a width of the blocking area of the shadow mask may be in a range from about 0.4 mm to about 0.6 mm.

In one exemplary embodiment, the method may further include forming a light-blocking pattern between the common voltage subsidiary line and the common electrode to cover the common voltage subsidiary line and the light-blocking pattern has a subsidiary line contact hole, the common electrode may be electrically connected to the common voltage subsidiary line through the subsidiary line contact hole.

In an exemplary organic light-emitting display apparatus according to the present invention, the organic light-emitting display apparatus includes; an organic light-emitting substrate configured to emit light, an opposite substrate facing the organic light-emitting substrate, and a sealing member enclosing a gap between the organic light-emitting substrate and the opposite substrate, wherein the organic light-emitting substrate includes; a base substrate including a display area and a peripheral area formed around the display area, an OLED including a pixel electrode, a common electrode and an organic light-emitting part, the pixel electrode being disposed in a unit pixel of the display area, the common electrode being disposed over the display area, and the organic light-emitting part being disposed between the pixel electrode and the common electrode, a driving circuit part electrically connected to the pixel electrode, the driving circuit part being configured to apply driving current to the pixel electrode, and a common voltage subsidiary line disposed on substantially the same layer as the pixel electrode, spaced apart from the pixel electrode, disposed under the common electrode, and electrically connected to the common electrode.

In one exemplary embodiment, the organic light-emitting part may emit white light, and the opposite substrate includes a color filter.

According to the present invention, the common voltage is applied to the common electrode through the common voltage subsidiary line having the resistance lower than that of the common electrode, so that the common voltage may be prevented from being changed according to a position due to the resistance of the common electrode. Therefore, the common voltage subsidiary line may enhance display quality.

In addition, the plurality of organic light-emitting parts is formed by the shadow mask, so that a manufacturing process for the organic light-emitting parts may be simplified.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
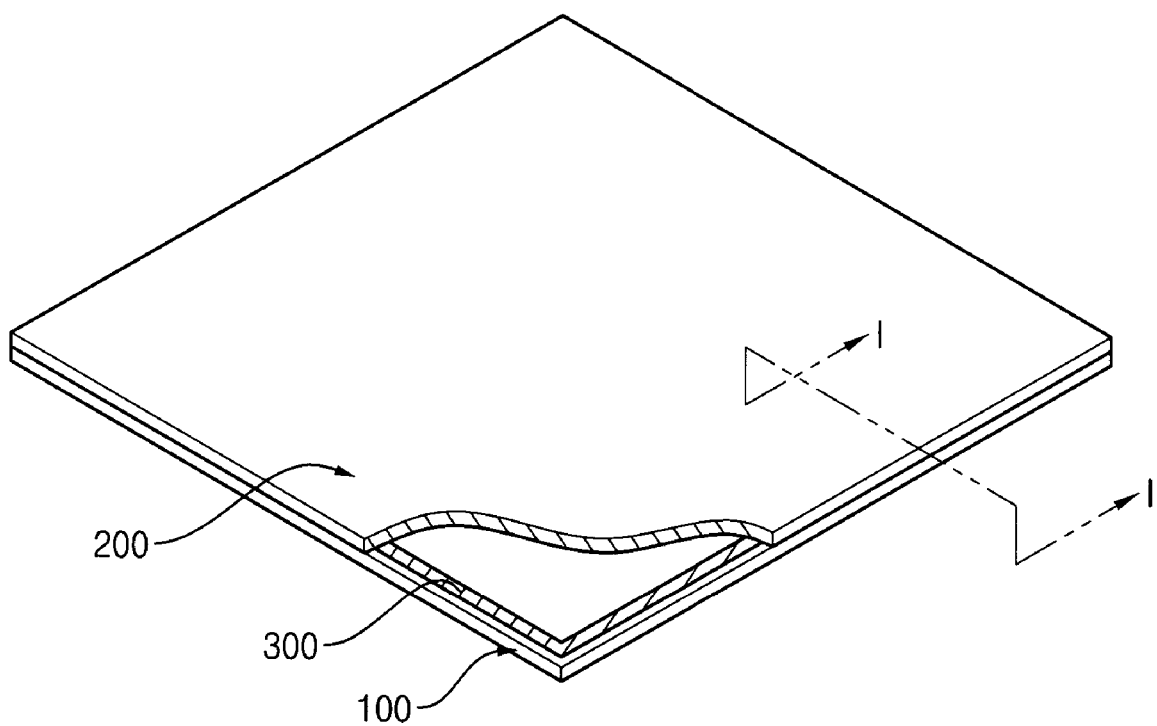
FIG. 1 is a perspective view illustrating an exemplary embodiment of an organic light-emitting display apparatus according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements or layers may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
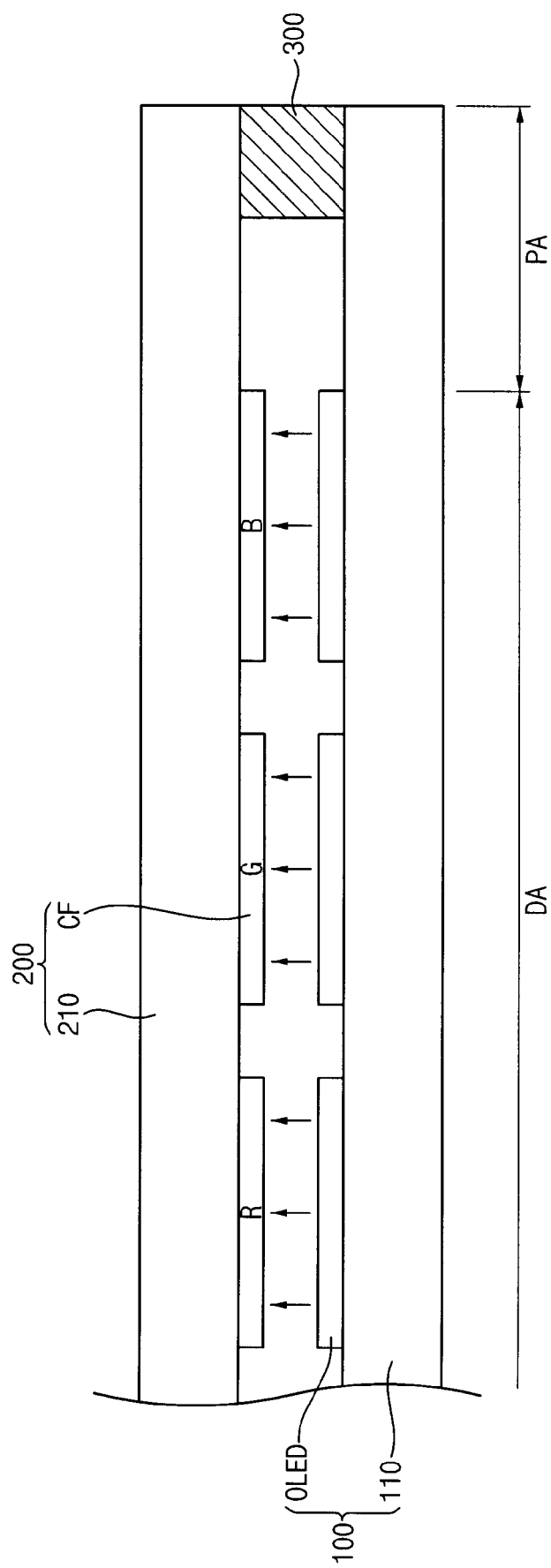
FIG. 2 is a cross-sectional view taken along line I-I' in FIG. 1.

FIG. 1 is a perspective view illustrating an exemplary embodiment of an organic light-emitting display apparatus according to the present invention. FIG. 2 is a cross-sectional view taken along line I-I' in FIG. 1.

Referring to FIGS. 1 and 2, the exemplary embodiment of an organic light-emitting display apparatus according to the present invention includes an organic light-emitting substrate 100 configured to emit light, an opposite substrate 200 facing the organic light-emitting substrate 100, and a sealing member 300 disposed between the organic light-emitting substrate 100 and the opposite substrate 200.

The organic light-emitting substrate 100 includes a base substrate 110, and a plurality of organic light-emitting diodes ("OLEDs") formed on the base substrate 110. In one exemplary embodiment, each of the plurality of OLEDs respectively corresponds to a single unit pixel, wherein a plurality of unit pixels may be combined to display an image.

In the present exemplary embodiment, the base substrate 110 has a plate shape, and may be transparent. Exemplary embodiments of the base substrate 110 may include a transparent glass, quartz, a synthetic resin, or other materials with similar characteristics. The base substrate 110 is divided into a display area DA displaying an image and a peripheral area PA formed around the display area DA.

In one exemplary embodiment, the OLEDs may be arranged in the display area DA of the base substrate 110 in a matrix shape. The OLEDs are self-emissive and emit a light. In the present exemplary embodiment, the OLEDs emit a white light. Alternative exemplary embodiments include configurations wherein the arrangement and the light-emitting color vary as would be apparent to one of ordinary skill in the art.

The opposite substrate 200 may include a protective substrate 210 and a plurality of color filters CF formed on the protective substrate 210. In the exemplary embodiment wherein the OLEDs include a variety of colors, the color filters CF may be omitted.

The protective substrate 210 faces the organic light-emitting substrate 100 to protect the OLEDs. The protective substrate 210 has a plate shape and is transparent similar to the base substrate 110.

The color filters CF are formed on a surface of the protective substrate 210 facing the organic light-emitting substrate 100, and correspond to the OLEDs. In one exemplary embodiment, the color filters CF may include red color filters, green color filters and blue color filters. In such an exemplary embodiment, the white colors emitted from the OLEDs pass through the color filters CF and may be used to display a color image.

The sealing member 300 is formed along the peripheral area PA of the base substrate 110, to combine the base substrate 110 with the protective substrate 210. Therefore, the sealing member 300 encloses a gap between the base substrate 110 and the protective substrate 210. In one exemplary embodiment, the sealing member 300 may include a material preventing the penetration of air and moisture. Exemplary embodiments of the sealing member 300 may include a frit glass.

In the above-mentioned exemplary embodiment, the OLEDs emit white light, and the opposite substrate 200 includes the color filters CF. As discussed briefly above, in an alternative exemplary embodiment, the OLEDs may be self-emissive and emit red light, green light and blue light to display the image. Thus, in such an alternative exemplary embodiment, the opposite substrate 200 may not include the color filters CF.

Figure 3:
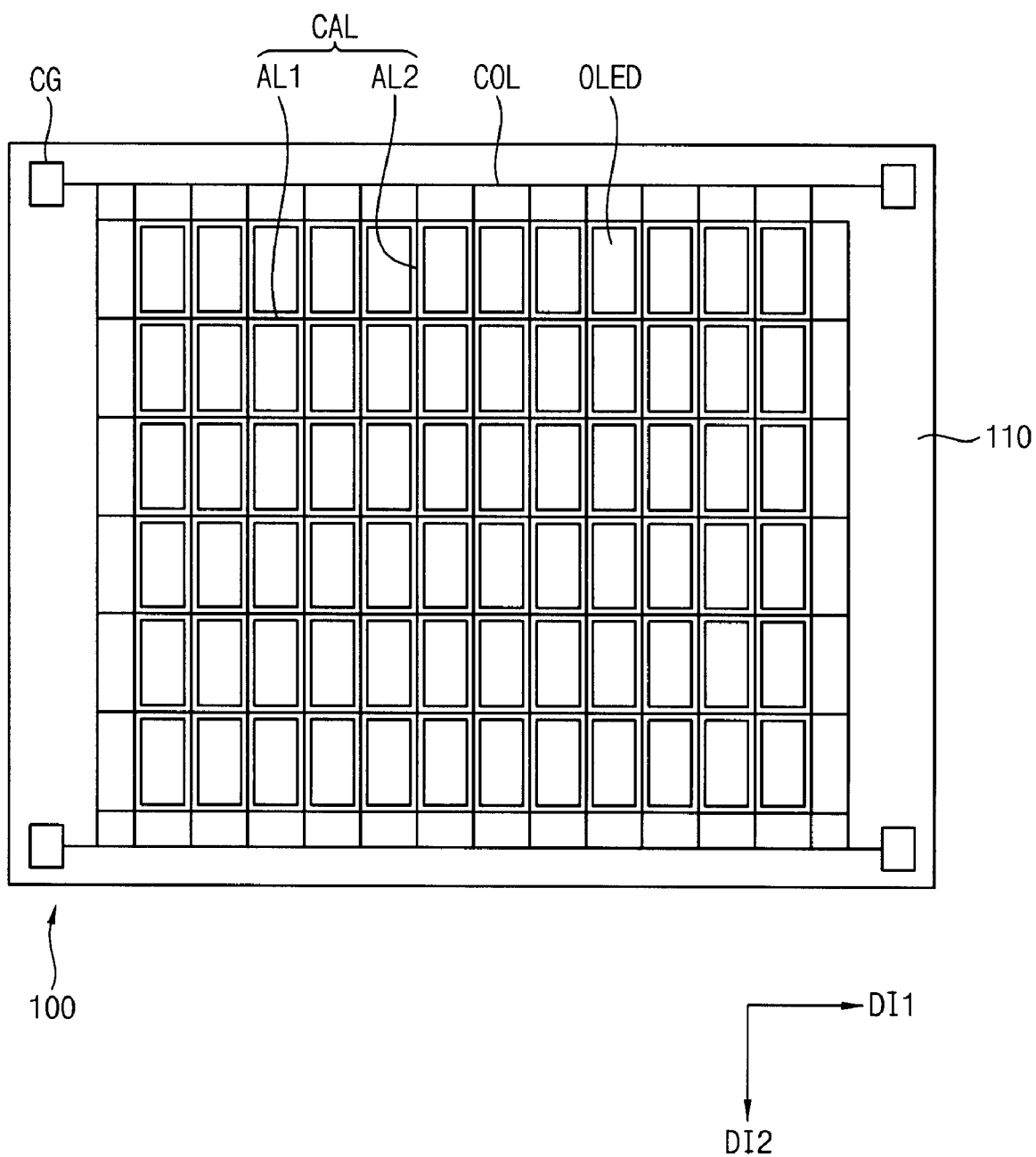
FIG. 3 is a top plan layout view illustrating an exemplary embodiment of an organic light-emitting substrate according to an exemplary embodiment of the organic light-emitting display apparatus in FIG. 1.

FIG. 3 is a top plan layout view illustrating an exemplary embodiment of an organic light-emitting substrate according to an exemplary embodiment of the organic light-emitting display apparatus in FIG. 1.

Referring to FIG. 3, the organic light-emitting substrate 100 further includes a common voltage subsidiary line CAL formed on the base substrate 110. The organic light-emitting substrate 100 may further include a common voltage outer line COL electrically connected to the common voltage subsidiary line CAL, and a common voltage generating part CG providing the common voltage to the common voltage outer line COL.

The common voltage subsidiary line CAL may include first subsidiary lines AL1 formed along a first direction DI1, and second subsidiary lines AL2 formed along a second direction DI2 substantially perpendicular to the first direction DI1. The OLEDs are electrically connected to the common voltage subsidiary line CAL, respectively.

The first and second subsidiary lines AL1 and AL2 substantially surround the OLEDs formed on the base substrate 110. In one exemplary embodiment, the common voltage subsidiary line CAL may have a shape completely encircling each of the unit pixels.

In one exemplary embodiment, the common voltage outer line COL may be formed at a side of the base substrate 110. According to one such exemplary embodiment, the common voltage outer line COL may be formed in the peripheral area PA as shown in FIG. 2. The common voltage outer line COL is electrically connected to the first and second subsidiary lines AL1 and AL2.

In the present exemplary embodiment, the common voltage outer line COL is electrically connected to the common voltage generating part CG disposed at the side of the base substrate 110. The common voltage generating part CG generates the common voltage, and provides the common voltage to the OLEDs via the common voltage subsidiary line CAL and the common voltage outer line. In one exemplary embodiment the common voltage generating part CG may be omitted, and a pad for connection to an externally disposed common voltage generating part may be substituted in its place.

In one exemplary embodiment, the common voltage generating part CG may be formed to correspond to at least one of four edges of the base substrate. In one such exemplary embodiment, the common voltage generating part CG may be formed to correspond to all of the four edges of the base substrate 110.

Figure 4:
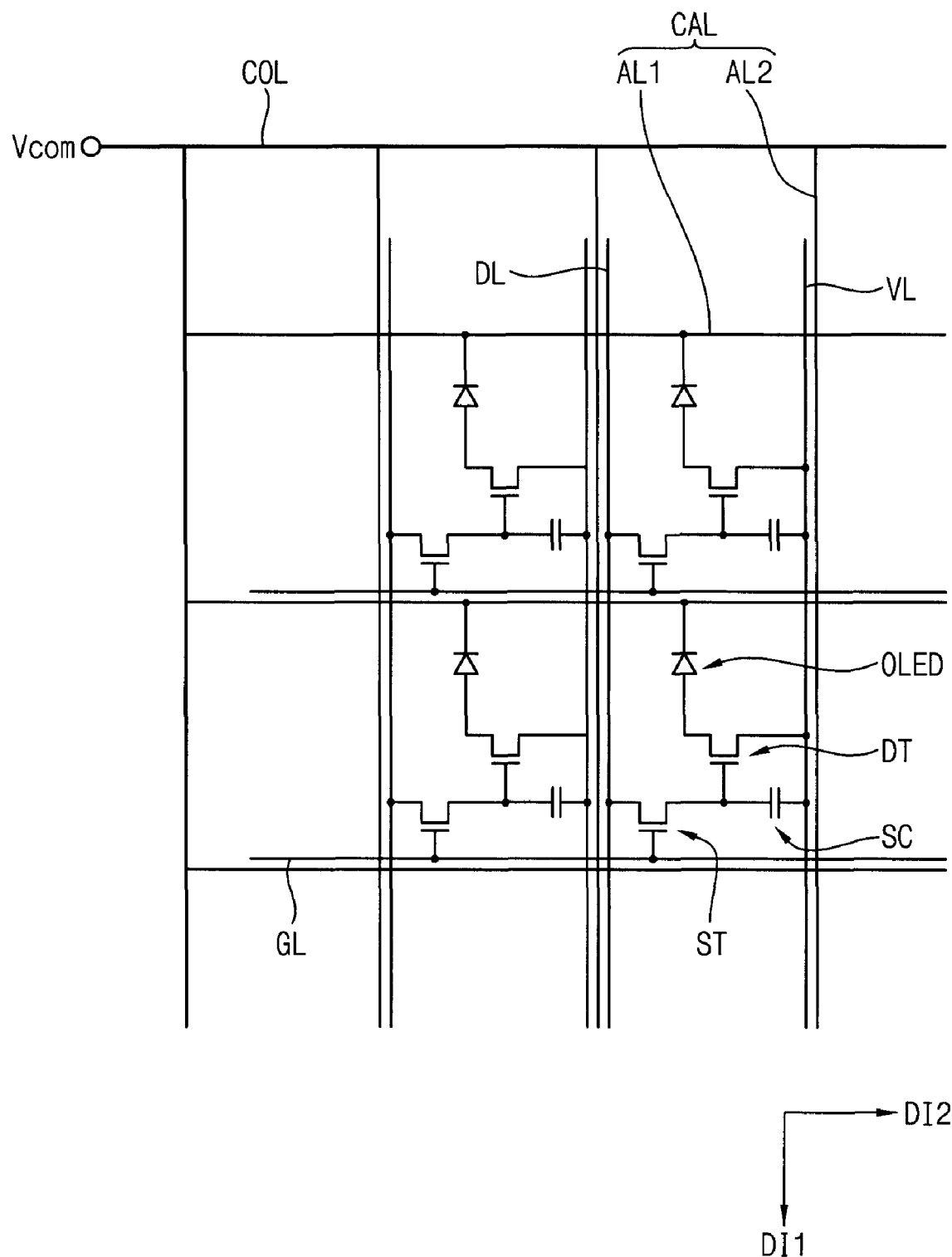
FIG. 4 is an equivalent circuit diagram partially illustrating the exemplary embodiment of an organic light-emitting substrate in FIG. 3.

FIG. 4 is an equivalent circuit diagram partially illustrating the exemplary embodiment of an organic light-emitting substrate of FIG. 3. Referring to FIG. 4, the organic light-emitting substrate 100 in FIG. 3 may further include driving circuit parts. The driving circuit parts are electrically connected to the OLEDs, respectively, to provide a driving current to the OLEDs.

Each of the driving circuit parts may include a gate line GL, a data line DL, a bias line VL, a switching transistor ST, a driving transistor DT and a storage capacitor SC. The gate line GL may be formed along the first direction DI1 substantially parallel with the first subsidiary line AL1. The data line DL may be formed along the second direction DI2 substantially parallel with the second subsidiary line AL2. In one exemplary embodiment the bias line VL may be formed along the second direction DI2 substantially parallel with the second subsidiary line AL2, although alternative exemplary embodiments include configurations wherein the bias line VL may be formed in the first direction DI1.

The switching transistor ST is electrically connected to the gate line GL, the data line DL and the driving transistor DT. The driving transistor DT is electrically connected to the switching transistor ST, the bias line VL and an organic light-emitting diode ("OLED"). The storage capacitor SC may be electrically connected to the driving transistor DT and the bias line VL. The OLED is electrically connected to the driving transistor DT and the common voltage subsidiary line CAL.

In one exemplary embodiment, the OLED may be driven as follows. A gate signal may be applied to the gate line GL to turn on the switching transistor ST, and then a data signal transferred along the data line DL may be applied to the driving transistor DT to turn on the driving transistor DT. The data signal is stored by the storage capacitor SC to turn on the driving transistor DT for a single frame. Therefore, the driving current to drive the OLED is applied to the OLED from the bias line VL, so that light is omitted from the OLED with an intensity corresponding to the data signal.

Figure 5:
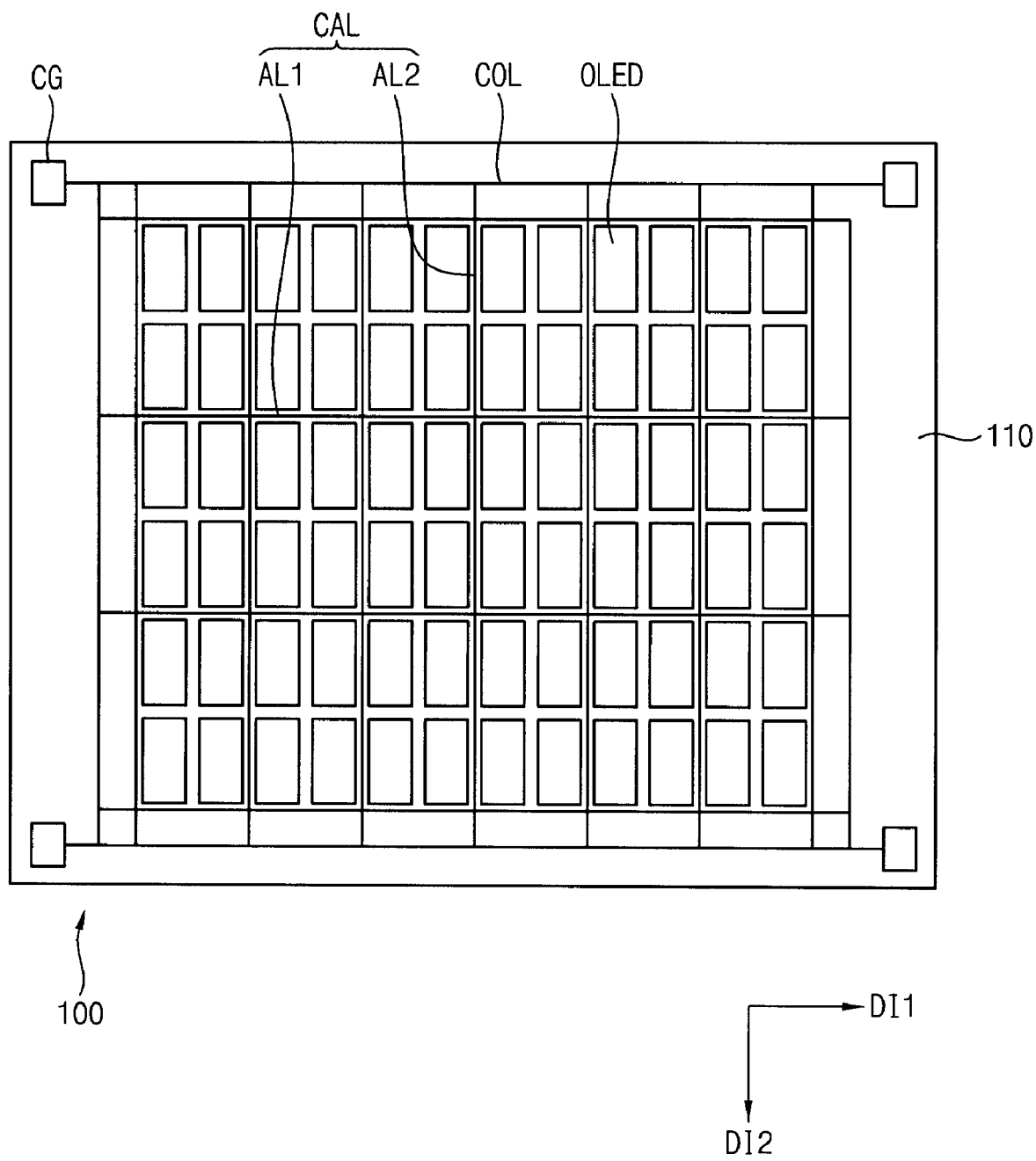
FIG. 5 is a top plan layout view illustrating another exemplary embodiment of an organic light-emitting substrate according to an exemplary embodiment of the organic light-emitting display apparatus in FIG. 1.
Figure 6:
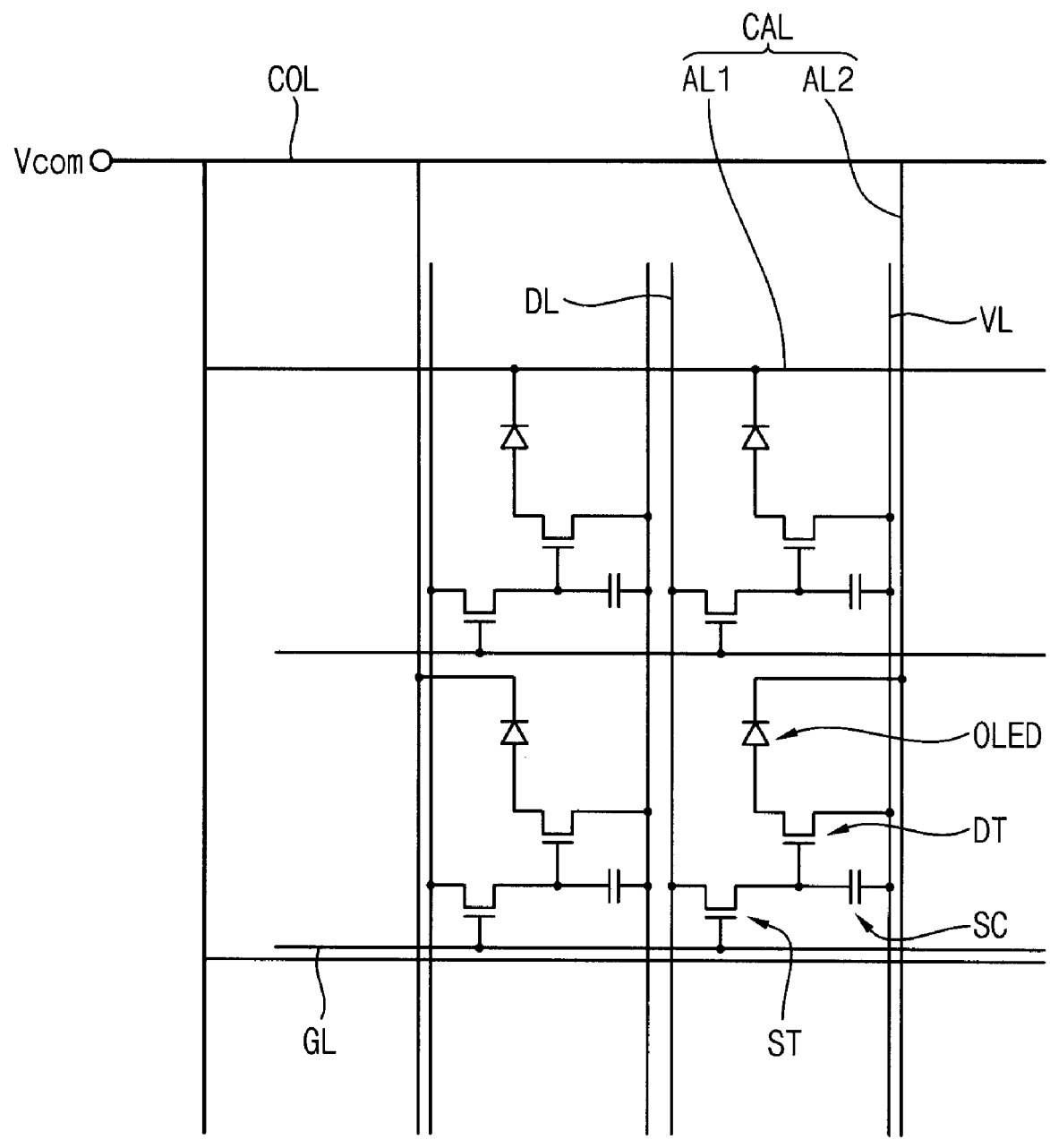
FIG. 6 is an equivalent circuit diagram partially illustrating the exemplary embodiment of an organic light-emitting substrate in FIG. 5.

FIG. 5 is a top plan layout view illustrating another exemplary embodiment of an organic light-emitting substrate according to the present invention, and FIG. 6 is an equivalent circuit diagram partially illustrating the organic light-emitting substrate in FIG. 5.

Referring to FIGS. 5 and 6, the common voltage subsidiary line CAL may be formed to surround an outline of a unit block having a plurality of unit pixels. In such an exemplary embodiment, each of the OLEDs is still respectively disposed in the unit pixels.

In the present exemplary embodiment, the unit block may include unit pixels arranged in a matrix shape having two columns and two rows. Alternatively, the unit block may include a single unit pixel as illustrated in FIG. 4. In addition, the unit block may include the unit pixels arranged in a matrix with three columns and three rows, or with four columns and four rows, and so on.

Figure 7:
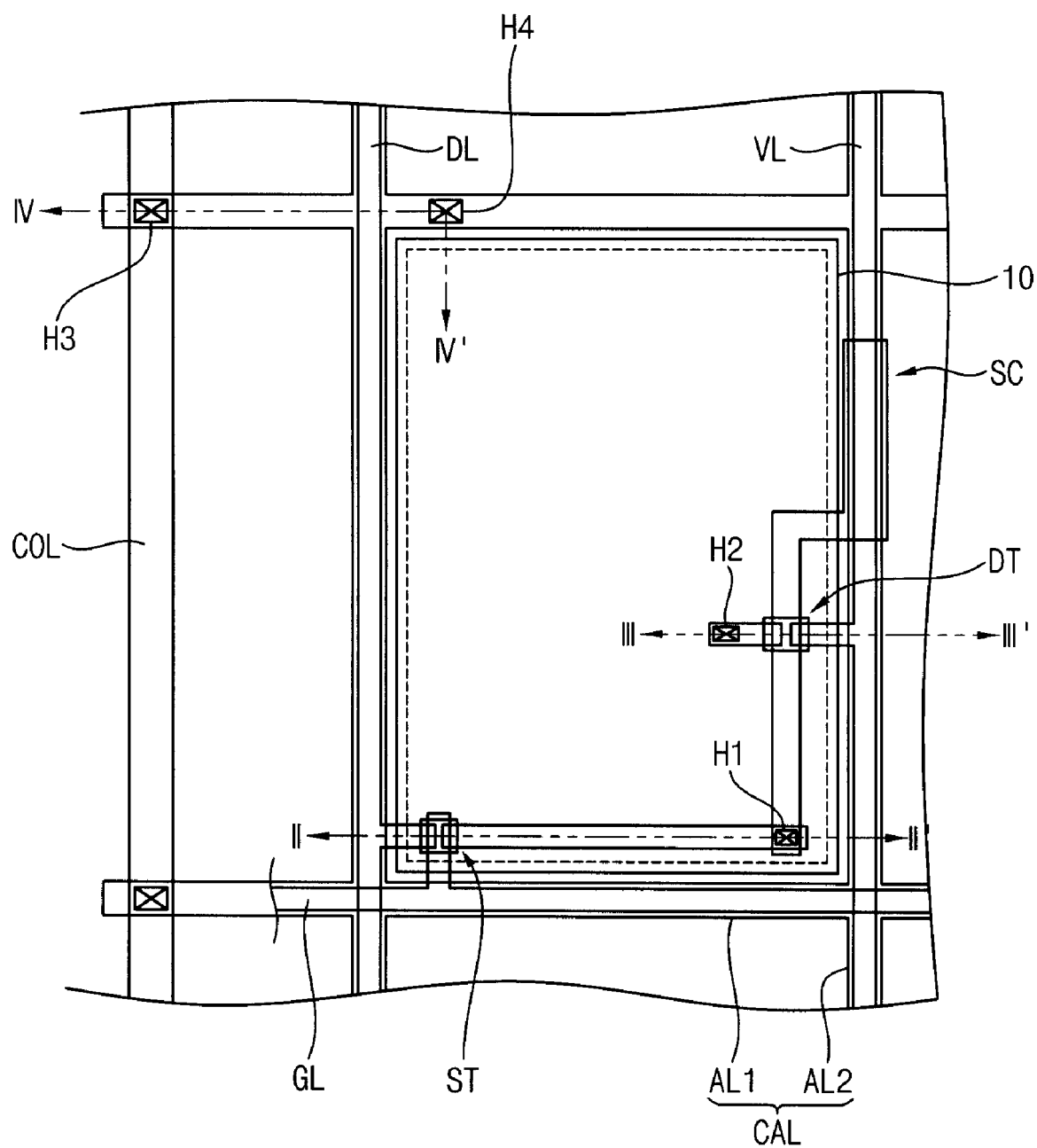
FIG. 7 is a top plan layout view partially illustrating the exemplary embodiment of an organic light-emitting substrate in FIG. 3.
Figure 8:
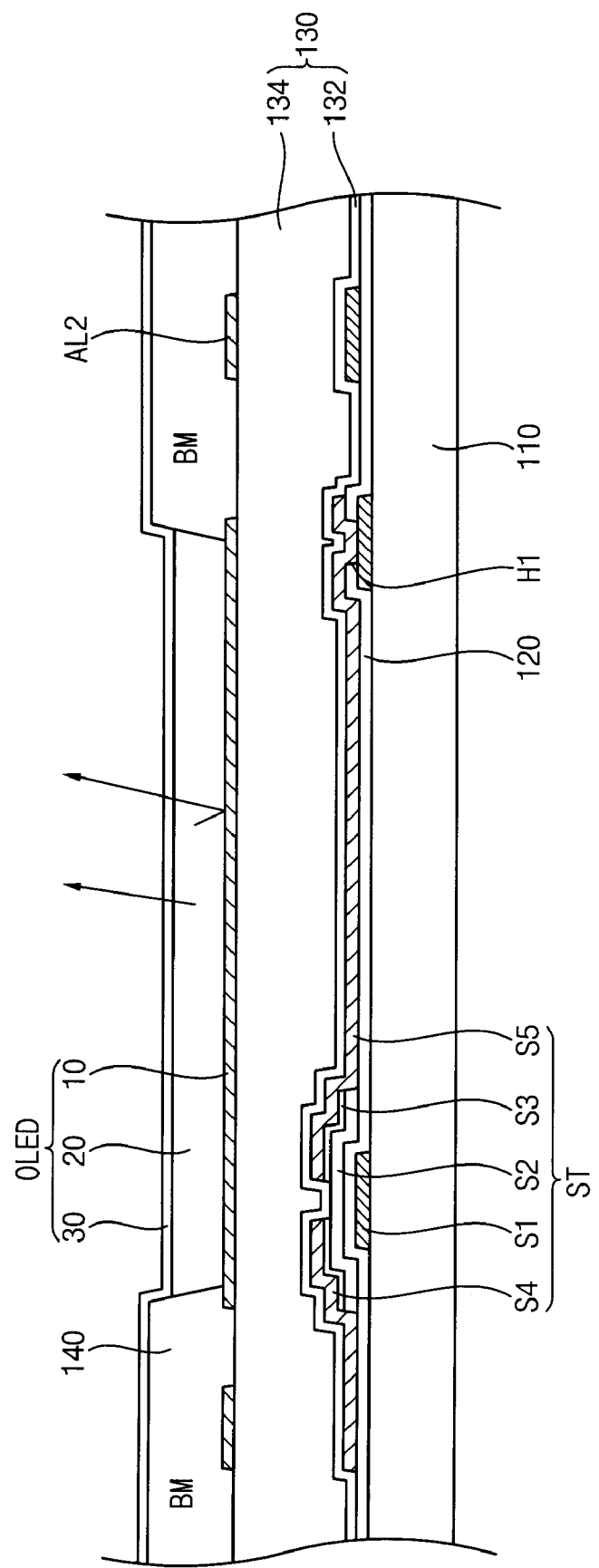
FIG. 8 is a cross-sectional view taken along line II-II' in FIG. 7.
Figure 9:
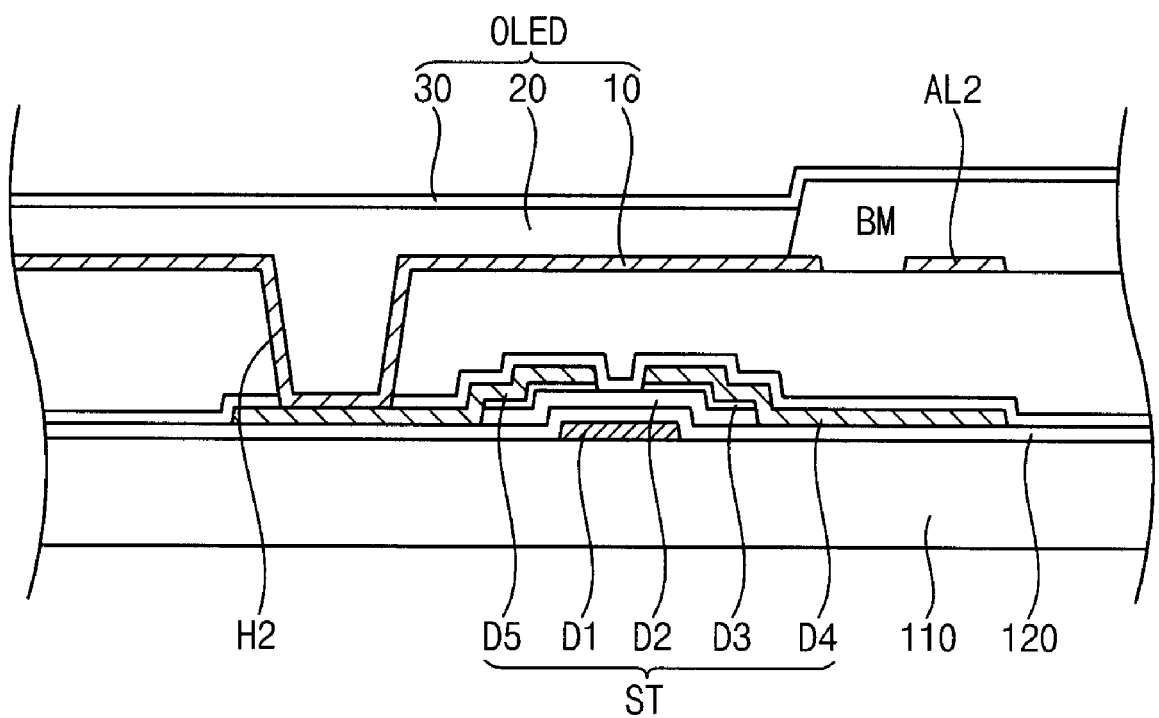
FIG. 9 is a cross-sectional view taken along line III-III' in FIG. 7.
Figure 10:
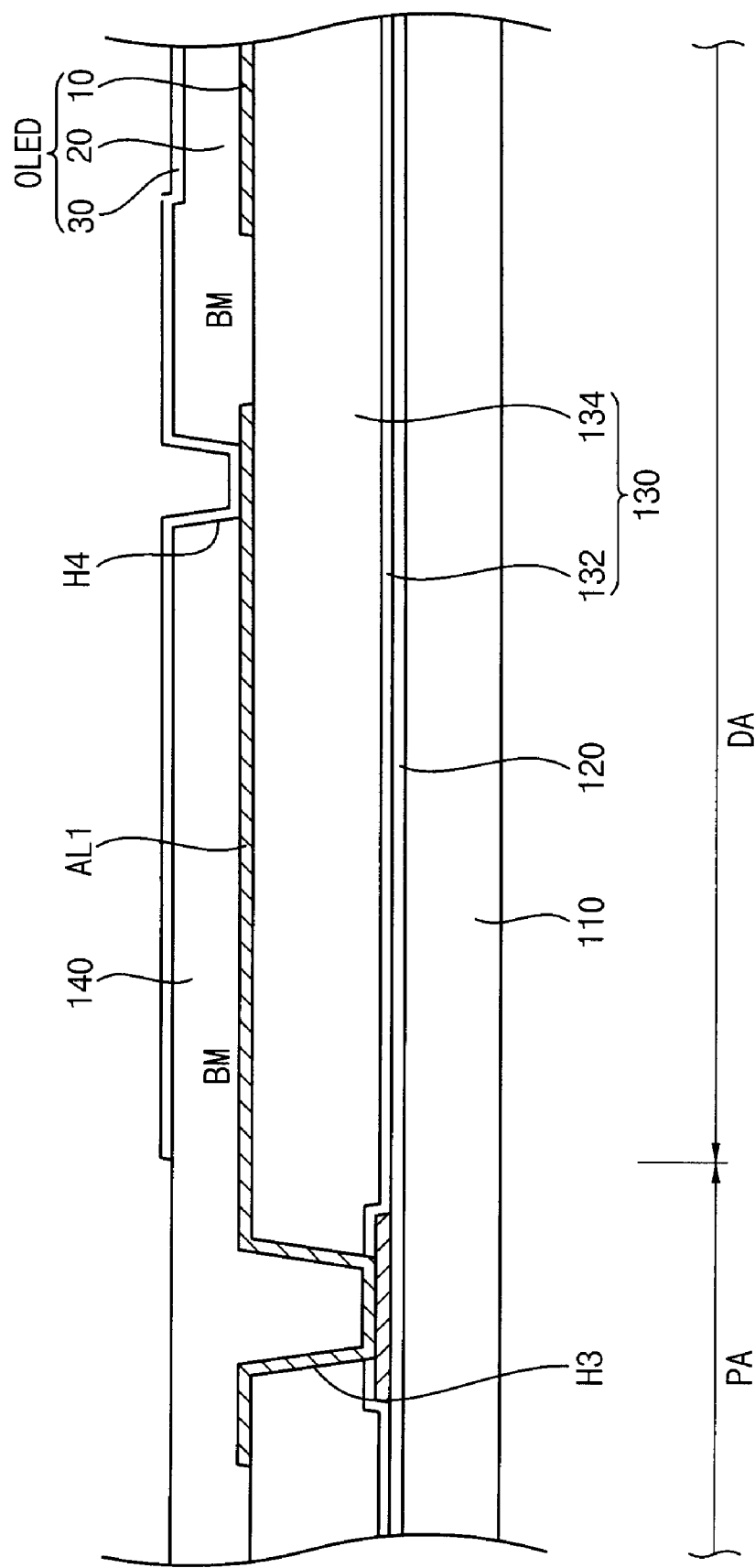
FIG. 10 is a cross-sectional view taken along line IV-IV' in FIG. 7.

FIG. 7 is a top plan layout view partially illustrating the exemplary embodiment of an organic light-emitting substrate of FIG. 3, FIG. 8 is a cross-sectional view taken along line II-II' in FIG. 7, FIG. 9 is a cross-sectional view taken along line III-III' in FIG. 7, and FIG. 10 is a cross-sectional view taken along line IV-IV' in FIG. 7.

Referring to FIGS. 7, 8, 9 and 10, the exemplary embodiment of an organic light-emitting substrate 100 in FIG. 3 may further include a gate insulating layer 120, a protective layer 130 and a light-blocking pattern 140. Each of the OLEDs includes a pixel electrode 10, a light-emitting part 20 and a common electrode 30.

The switching transistor ST may include a switching gate electrode S1, a switching active pattern S2, a switching ohmic contact pattern S3, a switching source electrode S4 and a switching drain electrode S5.

The driving transistor DT may include a driving gate electrode D1, a driving active pattern D2, a driving ohmic contact pattern D3, a driving source electrode D4 and a driving drain electrode D5.

Elements of the organic light-emitting substrate 100 are explained as follows. First, the gate line GL, the switching gate electrode S1 and the driving gate electrode D1 are formed on the base substrate 110. In one exemplary embodiment, the gate line GL, the switching gate electrode S1 and the driving gate electrode D1 may be formed via patterning a gate metal layer formed on the base substrate 110.

The gate line GL extends along the first direction DI1, and the switching gate electrode S1 extends from the gate line GL along the second direction DI2. Alternative exemplary embodiments include configurations wherein, the switching gate electrode S1 may be formed separately the gate line GL or wherein the switching gate electrode S1 may be an enlargement of the gate line GL.

The driving gate electrode D1 is spaced apart from the gate line GL and the switching gate electrode S1. For example, the driving gate electrode D1 may extend along the second direction DI2.

The gate insulating layer 120 is formed on the base substrate 110 to cover the gate line GL, the switching gate electrode S1 and the driving gate electrode D1. In one exemplary embodiment, the gate insulating layer 120 includes an inorganic material, for example, silicon oxide (SiOx) or silicon nitride (SiNx).

The switching active pattern S2 is formed on the gate insulating layer 120 to overlap with the switching gate electrode S1. The driving active pattern S2 is formed on the gate insulating layer 120 to overlap with the driving gate electrode D1. In addition, the switching ohmic contact pattern S3 is formed on the switching active pattern S2 and is divided into two portions spaced apart from each other with respect to switching gate electrode S1. The driving ohmic contact pattern D3 is formed on the driving active pattern D2 and is divided into two portions spaced apart from each other with respect to the driving gate electrode D1.

The data line DL, the bias line VL and the common voltage outer line COL are formed on the gate insulating layer 120. In addition, the switching source electrode S4, the switching drain electrode S5, the driving source electrode D4 and the driving drain electrode D5 are formed on the gate insulating layer 120.

In this case, the data line DL, the bias line VL, the common voltage outer line COL, the switching source electrode S4, the switching drain electrode S5, the driving source electrode D4 and the driving drain electrode D5 are formed via patterning a data metal layer formed on the gate insulating layer 120, to cover the switching active pattern S2, the switching ohmic contact pattern S3, the driving active pattern D2 and the driving ohmic contact pattern D3. In an alternative exemplary embodiment, the common voltage outer line COL may be formed between the gate insulating layer 120 and the base substrate 110. In such an alternative exemplary embodiment, the common voltage outer line COL may be formed via patterning the gate metal layer.

The data line DL may extend along the first direction DI1. In one exemplary embodiment, the switching source electrode S4 may be divided from the data line DL along the second direction DI2. In an alternative exemplary embodiment, the switching source electrode S4 may be a portion of the data line DL. A portion of the switching source electrode S4 is formed on a portion of the switching ohmic contact pattern S3.

The switching drain electrode S5 may be spaced apart from the switching source electrode S4 with respect to the switching gate electrode S1 and may extend along the second direction DI2. A portion of the switching drain electrode S5 is formed on a portion of the switching ohmic contact pattern S3.

The bias line VL may extend along the first direction DI1. In one exemplary embodiment, the driving source electrode D4 may be divided from the bias line VL along a direction substantially opposite to the second direction DI2. IN an alternative exemplary embodiment, the driving source electrode D4 may be a portion of the bias line VL. A portion of the driving source electrode D4 is formed on a first portion of the driving ohmic contact pattern D3.

The driving drain electrode D5 is spaced apart from the driving source electrode D4 with respect to the driving gate electrode D1 to extend along the direction substantially opposite to the second direction DI2. A portion of the driving drain electrode D5 is formed on a second portion of the driving ohmic contact pattern D3.

The bias line VL overlaps with the driving gate electrode D1 to form the storage capacitor SC. In the present exemplary embodiment, the storage capacitor SC may include a portion of the driving gate electrode D1 and a portion of the bias line VL.

In addition, the switching drain electrode S5 may be formed on the gate insulating layer 120 to overlap with the driving gate electrode D1, and may be electrically connected to the driving gate electrode D1 through an electrode connecting contact hole H1 formed through the gate insulating layer 120.

The common voltage outer line COL is formed in the peripheral area PA of the base substrate 110. In one exemplary embodiment, the common voltage outer line COL may be formed at the side of the base substrate 110 along the first and second directions DI1 and DI2.

The protective layer 130 is formed on the gate insulating layer 120, to cover the data line DL, the bias line VL, the common voltage outer line VOL, the switching transistor ST and the driving transistor DT. The protective layer 130 may include a passivation layer 132 and an organic insulating layer 134. The passivation layer 132 is formed on the gate insulating layer 120, to cover the data line DL, the bias line VL, the common voltage outer line VOL, the switching transistor ST and the driving transistor DT. In one exemplary embodiment, the organic insulating layer 134 is formed on the passivation layer 132 to planarize a surface of the passivation layer 132. In an alternative exemplary embodiment, the protective layer 130 may include one of the passivation layer 132 and the organic insulating layer 134 and omit the other.

The pixel electrode 10 and the common voltage subsidiary line CAL are formed on the protective layer 130. In such an exemplary embodiment, the pixel electrode 10 and the common voltage subsidiary line CAL may be formed via patterning a pixel electrode layer formed on the protective layer 130.

The pixel electrode 10 is formed separately in each of the plurality of unit pixels. The pixel electrode 10 may be connected to the driving drain electrode D5 through a pixel contact hole H2 formed through the protective layer 130. In one exemplary embodiment, the pixel electrode 10 may be opaque, which substantially blocks the transmission of light therethrough. In one such exemplary embodiment, the pixel electrode 10 may include a reflective electrode reflecting light emitted from the light emitting part 20 of the OLED.

In the exemplary embodiment wherein the pixel electrode 10 includes the reflective electrode, the pixel electrode 10 may be formed above a portion of the driving circuit part formed in the unit pixel. For example, the pixel electrode 10 may be formed in the unit pixel to cover the switching transistor ST and the driving transistor DT.

The common voltage subsidiary line CAL may be spaced apart from the pixel electrode 10, and may surround an outline of the pixel electrode 10. For example, the common voltage subsidiary line CAL may be formed on the protective layer 130, to cover the gate line GL, the data line DL and the bias line VL.

In one exemplary embodiment, the common voltage subsidiary line CAL may be a low resistance line having a relatively low resistance. In one exemplary embodiment, the common voltage subsidiary line CAL may include substantially the same material as the pixel electrode 10.

The common voltage subsidiary line CAL including the first and second subsidiary lines AL1 and AL2 extends to the peripheral area PA to overlap with the common voltage outer line COL. The common voltage subsidiary line CAL is electrically connected to the common voltage outer line COL through an outer line contact hole H3 formed through the protective layer 130.

The light-blocking pattern 140 is formed on the protective layer 130 along the outline of the unit pixels. In one exemplary embodiment, the light-blocking pattern 140 is formed on the protective layer 130 to cover the common voltage subsidiary line CAL. Thus, the light-blocking pattern 140 may cover the gate line GL, the data line DL, the bias line VL, and other various components as would be apparent to one of ordinary skill in the art.

In one exemplary embodiment, the light-blocking pattern 140 may be formed via patterning a light-blocking layer formed on the protective layer 130, to cover the pixel electrode 10 and the common voltage subsidiary line CAL. In such an exemplary embodiment, the light-blocking layer is patterned to externally expose the pixel electrode 10. In one exemplary embodiment, the light-blocking pattern 140 may be an organic black matrix configured to block the light from the light emitting part 20. In one exemplary embodiment, the light-blocking pattern 140 may include a black colored carbon to absorb the light.

In the present exemplary embodiment, the organic light-emitting part 20 is formed on the pixel electrode 10. In one exemplary embodiment, the organic light-emitting part 20 may be formed in a light transmitting groove of the light-blocking pattern 140, wherein the groove exposes the pixel electrode 10. In such an exemplary embodiment, the organic light-emitting part 20 may cover a side of the light-blocking pattern 140.

The organic light-emitting part 20 may include a red light-emitting material emitting a red light, a green light-emitting material emitting a green light and a blue light-emitting material emitting a blue light. In one exemplary embodiment, the red light emitted by the red light-emitting material, the green light emitted by the green light-emitting material and the blue light emitted by the blue light-emitting material may be mixed to emit a white light. In another exemplary embodiment, the red, green and blue light-emitting materials may be mixed with one another or may be sequentially integrated to form the organic light-emitting part 20. In another exemplary embodiment, the organic light-emitting part 20 may include a white light-emitting material emitting a white light. Alternative exemplary embodiments include configurations wherein the red light-emitting material, the green light-emitting material and the blue light-emitting material are each separately disposed to form red light-emitting unit pixels, green light-emitting unit pixels and blue light-emitting unit pixels, respectively. In such an alternative exemplary embodiment, the color filters may be omitted.

The common electrode 30 is formed on the light-blocking pattern 140 and the organic light-emitting part 20, and is formed over the display area DA. The common electrode 30 may make electric contact with the common voltage subsidiary line CAL, for example, the first subsidiary line AL1 or the second subsidiary line AL2, through a subsidiary line contact hole H4 that is formed through the light-blocking pattern 140.

In the present exemplary embodiment, the common electrode 30 includes a transparent conductive material. In one exemplary embodiment, the common electrode 30 may be formed via depositing magnesium and aluminum alloy on the light-blocking pattern 140 and the light-emitting part 20. In one exemplary embodiment, the common electrode 30 has a thickness that is substantially the same as or less than about 100 Å, so that the light may easily pass through the common electrode 30. In the present exemplary embodiment, the common voltage subsidiary line CAL has a resistance lower than that of the common electrode 30, but the invention is not limited thereto.

Accordingly, the common electrode 30 is transparent and the pixel electrode 10 is opaque, so that the organic light-emitting substrate according to the present exemplary embodiment is a top emission type organic light-emitting substrate that emits the light toward an upper portion of the base substrate 110. However, it would be apparent to one of ordinary skill in the art that the present invention could also be applied to a bottom emission type organic light-emitting display.

Referring to FIGS. 7, 8, 9 and 10 again, a method for manufacturing the organic light-emitting substrate 100 in FIG. 3 is explained as follows.

First, the gate metal layer is formed on the base substrate 110, and then the gate metal layer is patterned. Thus, the gate line GL, the switching gate electrode S1 and the driving gate electrode D1 are formed. Then, the gate insulating layer 120 is formed on the base substrate 110 to cover the gate line GL, the switching gate electrode S1 and the driving gate electrode D1. The active layer and the ohmic contact layer are then sequentially integrated on the gate insulating layer 120, and then the active layer and the ohmic contact layer are patterned. Thus, the switching active pattern S2, the driving active pattern D2, the switching ohmic contact pattern S3 and the driving ohmic contact pattern D3 are formed.

The data metal layer is formed on the gate insulating layer 120 to cover the switching active pattern S2, the switching ohmic contact pattern S3, the driving active pattern D2 and the driving ohmic contact pattern D3, and then the data metal layer is patterned. Thus, the data line DL, the bias line VL, the common voltage outer line COL, the switching source electrode S4, the switching drain electrode S5, the driving source electrode D and the driving drain electrode D5 are formed.

The switching ohmic contact pattern S3 is then divided into two portions using the switching source electrode S4 and the switching drain electrode S5, and the driving ohmic contact pattern D3 is divided into two portions using the driving source electrode D4 and the driving drain electrode D5. Then, the protective layer 130 is formed on the gate insulating layer 120, to cover the data line DL, the bias line VL, the common voltage outer line VOL, the switching transistor ST and the driving transistor DT.

The protective layer 130 is patterned to form the electrode connecting contact hole H1, the pixel contact hole H2 and the outer line contact hole H3 through the protective layer 130. Then, the pixel electrode layer is formed on the protective layer 130, and then the pixel electrode layer is patterned to form the pixel electrode 10 and the common voltage subsidiary line CAL.

The light-blocking layer is formed on the protective layer 130 to cover the pixel electrode 10 and the common voltage subsidiary line CAL, and then the light-blocking layer is patterned to form the light-blocking pattern 140. In the current exemplary embodiment, the light-blocking pattern 140 includes the subsidiary line contact hole H4 through which the common voltage subsidiary line CAL is partially exposed.

The organic light-emitting part 20 is then formed on the pixel electrode 10. For example, the organic light-emitting part 20 may be formed in the light transmitting groove of the light-blocking pattern 140 exposing the pixel electrode 10.

Figure 11:
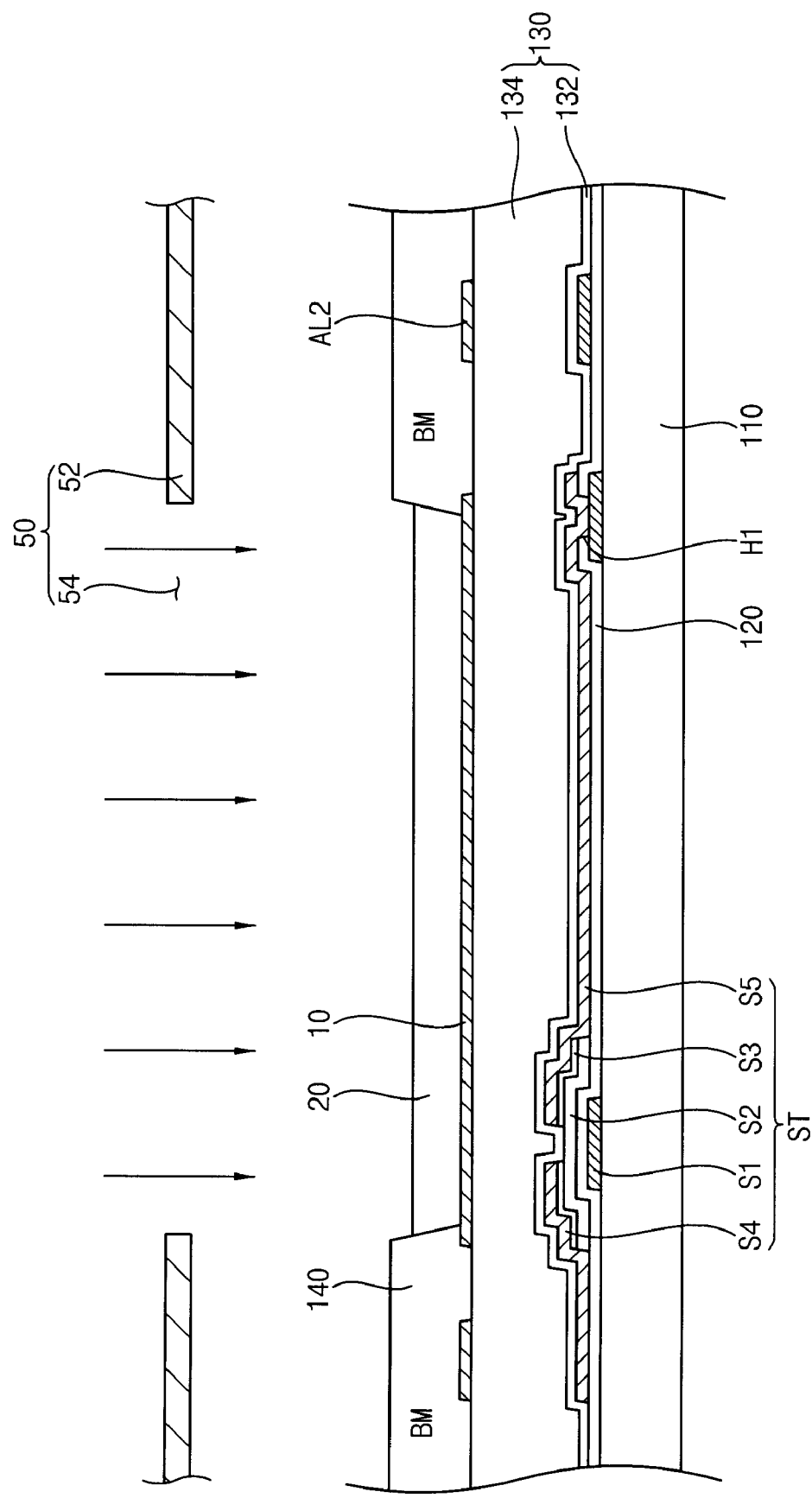
FIG. 11 is a cross-sectional view illustrating an exemplary embodiment of a deposition process of an organic light-emitting part using a shadow mask.
Figure 12A:
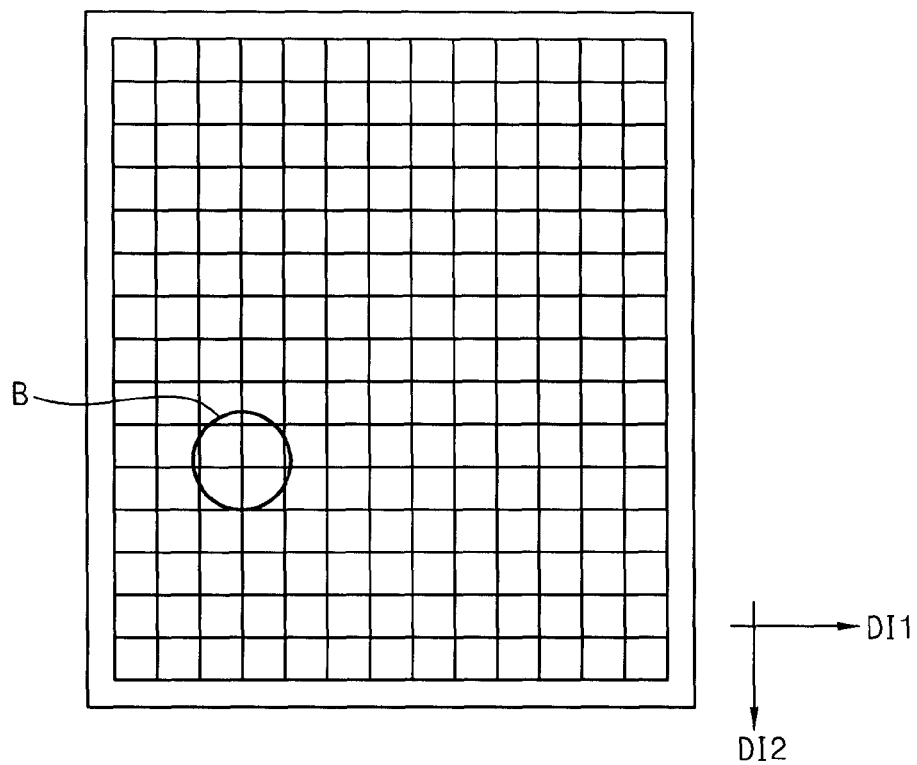
FIG. 12A is a top plan layout view illustrating the shadow mask in FIG. 11
Figure 12B:
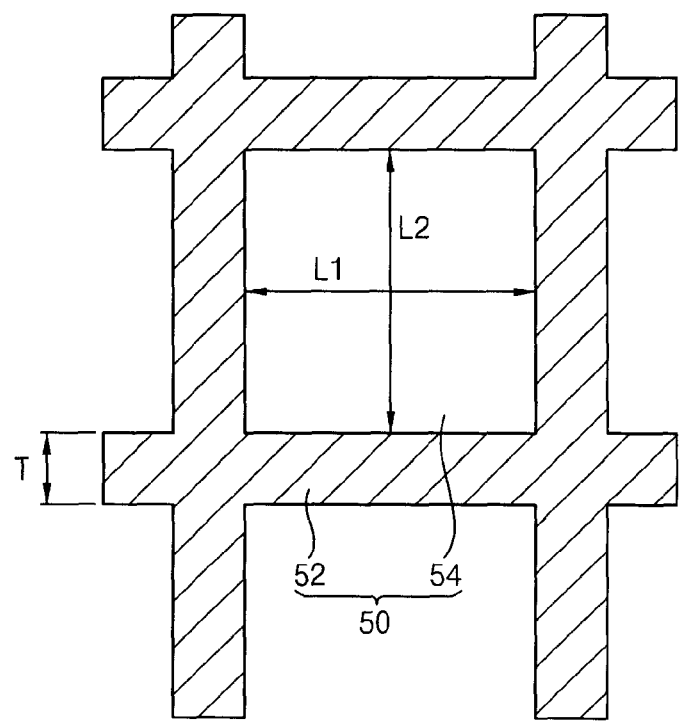
FIG. 12B is a top plan layout magnified view of the region B of FIG. 12A.
Figure 13:
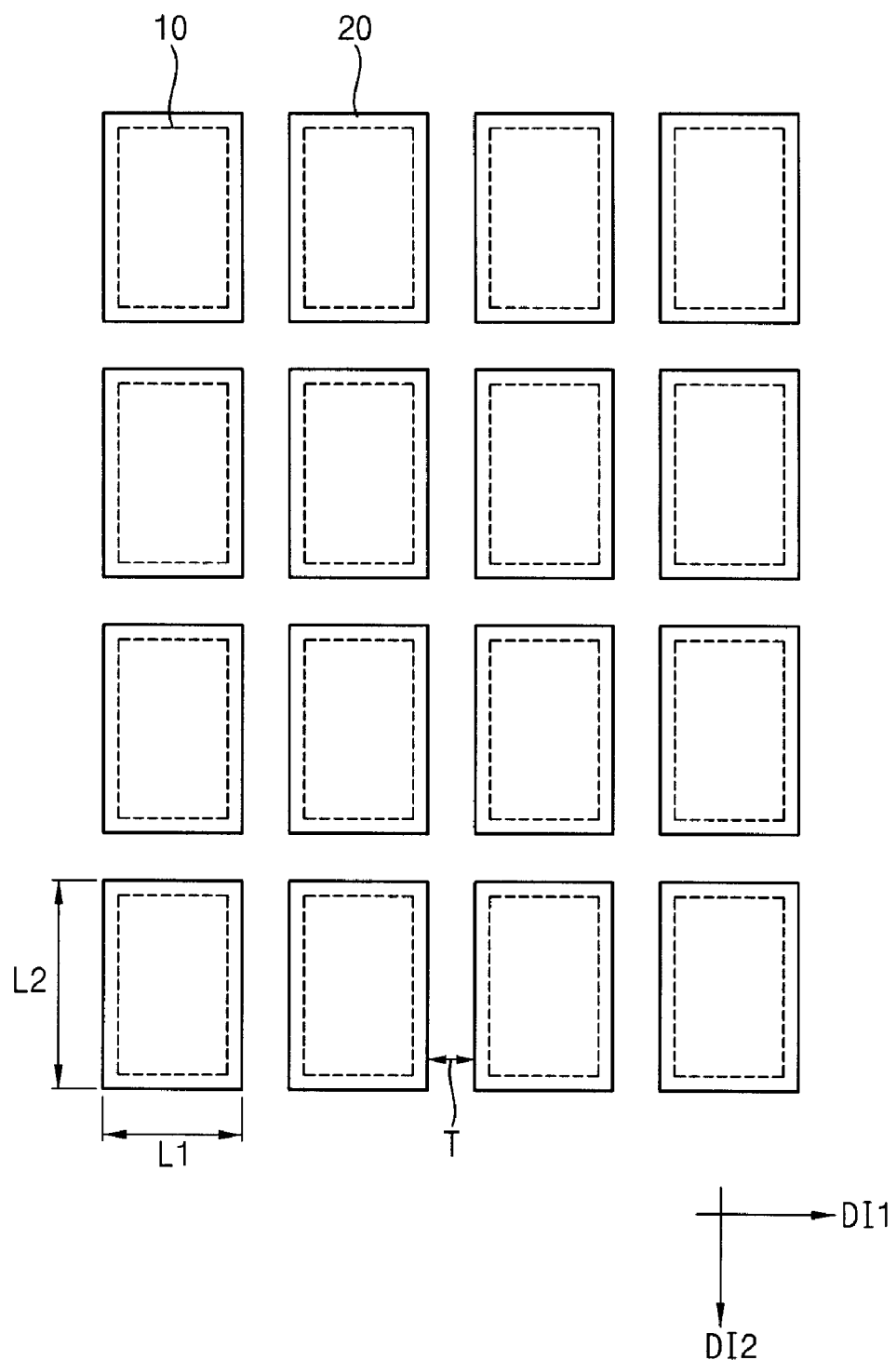
FIG. 13 is a top plan layout view illustrating the organic light-emitting part deposited through the shadow mask in FIGS. 12A and 12B.

FIG. 11 is a cross-sectional view illustrating an exemplary embodiment of a deposition process of an organic light-emitting part using a shadow mask, FIG. 12A is a top plan layout view illustrating the shadow mask in FIG. 11, FIG. 12B is a top plan layout view illustrating an enlarged portion A of FIG. 12A, and FIG. 13 is a top plan layout view illustrating the organic light-emitting part deposited through the shadow mask in FIGS. 12A and 12B.

Referring to FIGS. 11, 12A, 12B and 13, the organic light-emitting part 20 according to the present exemplary embodiment may be deposited on the pixel electrode 10 by a shadow mask 50. The shadow mask 50 is divided into a blocking area 52 and an opening area 54. An organic light-emitting deposition material forming the organic light-emitting part 20 passes through the opening area 54, whereas the organic light-emitting deposition material is blocked by the blocking area 52.

In the present exemplary embodiment, the opening area 54 has a rectangular shape that has a first edge having a first length L1 along the first direction DI1 and a second edge having a second length L2 along the second direction DI2. A width T of the blocking area 52 may be in a range between about 0.4 mm and about 0.6 mm. In one exemplary embodiment, the width T of the blocking area 52 may be about 0.5 mm.

The organic light-emitting part 20 may be deposited as follows. First, the shadow mask 50 is disposed over the first substrate 100 to be aligned with the first substrate 100. For example, the shadow mask 50 is disposed over the first substrate 100 so that the opening area 54 is aligned with the pixel electrode 10 or the blocking area 52 is aligned with the common voltage subsidiary line CAL. Then, the organic light-emitting deposition material is vaporized from an organic light-emitting source and is deposited on the pixel electrode 10 through the shadow mask 50, so that the organic light-emitting part 20 is formed. Thus, the organic light-emitting part 20 is formed to have substantially the same shape as the opening area 54 of the shadow mask 50.

The opening area 54 may be formed to correspond to each unit pixel of the first substrate 100. Accordingly, when the opening area 54 is formed corresponding to each unit pixel, the organic light-emitting part 20 is formed in each unit pixel as illustrated in FIG. 13. In the present exemplary embodiment, the organic light-emitting parts 20 may be respectively formed on the pixel electrodes 10.

In the present example embodiment, the organic light-emitting part 20 may be formed on an end portion of the light-blocking pattern 140, whereas the organic light-emitting part 20 is not formed in the subsidiary line contact hole H4.

Figure 14:
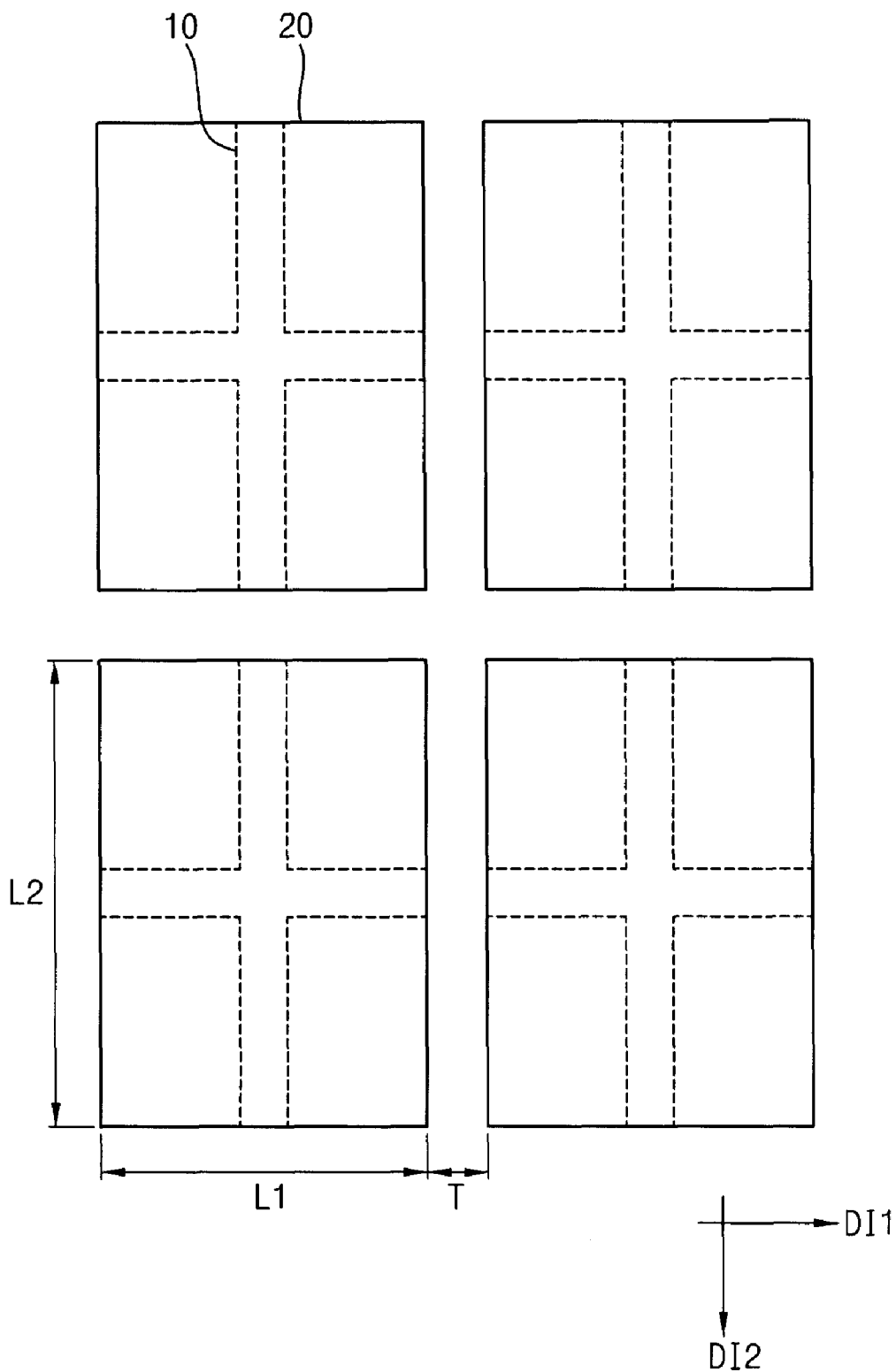
FIG. 14 is a top plan layout view illustrating the organic light-emitting part formed across a plurality of unit pixels.

FIG. 14 is a top plan layout view illustrating the organic light-emitting part formed across a plurality of unit pixels.

Referring to FIGS. 12 and 14, the opening area 54 of the shadow mask 50 may be formed to correspond to a plurality of unit pixels, in the exemplary embodiment shown in FIG. 14 the shadow mask corresponds to four unit pixels. Thus, the organic light-emitting part 20 may be formed across the plurality of unit pixels as illustrated in FIG. 14. For example, the organic light-emitting part 20 may be formed to cover the plurality of pixel electrodes 10 that is formed in the plurality of unit pixels.

In such an exemplary embodiment, when the organic light-emitting part 20 is formed across the plurality of unit pixels, the organic light-emitting part 20 includes a light-emitting material emitting white light.

When the opening area 54 is formed to correspond to the plurality of unit pixels, each of the first and second lengths L1 and L2 of the opening area 54 may be in a range between about 5 cm and about 25 cm. Thus, the organic light-emitting part 20 includes the rectangular shape that has the first edge having the first length L1 and the second edge having the second length L2. A distance between the organic light-emitting parts 20 is in the range between about 0.4 mm and about 0.6 mm, which is substantially the same as the width T of the blocking area 52.

Referring to FIG. 8 again, the common electrode 30 is finally formed on the light-blocking pattern 140 and the organic light-emitting part 20 Since the common electrode 30 is formed over the display area DA, the common voltage subsidiary line CAL is electrically connected to the common voltage outer line COL through the outer line contact hole H3, and the common electrode 30 is electrically connected to the common voltage subsidiary line CAL through the subsidiary line contact hole H4.

According to an exemplary embodiment of the present invention, the common voltage subsidiary line has a resistance lower than that of the common electrode, and the common voltage is provided to the common electrode through the common voltage subsidiary line. In exemplary embodiments of the present invention, the common voltage is not provided to the common electrode directly, however, the common voltage is provided to the common electrode through the common voltage subsidiary line having the resistance lower than the common electrode, so that the common voltage is prevented from being changed according to a position due to the relatively high resistance of the common electrode. Accordingly, the common voltage subsidiary line may enhance display quality of the organic light-emitting display apparatus.

In addition, the organic light-emitting parts are deposited over the substrate using the shadow mask, so that the process for forming the organic light-emitting parts may be more simplified.

Having described the exemplary embodiments of the present invention and its advantage, it is noted that various changes, substitutions and alterations can be made herein without departing from the spirit and scope of the invention as defined by appended claims.

What is claimed is:
1. An organic light-emitting substrate comprising:
a base substrate including a display area and a peripheral area formed around the display area;
an organic light-emitting diode including a pixel electrode, a common electrode and an organic light-emitting part, the pixel electrode being formed in a unit pixel of the display area, the common electrode being formed over the display area, and the organic light-emitting part being disposed between the pixel electrode and the common electrode;

a driving circuit part which applies driving current to the pixel electrode and is electrically connected to the pixel electrode; and a common voltage subsidiary line formed on substantially the same layer as the pixel electrode, spaced apart from the pixel electrode, disposed under the common electrode, and electrically connected to the common electrode.

2. The organic light-emitting substrate of claim 1, wherein the common voltage subsidiary line encloses an outline of a unit block and the unit block includes a plurality of unit pixels.

3. The organic light-emitting substrate of claim 2, wherein the organic light-emitting part is formed across the plurality of unit pixels.

4. The organic light-emitting substrate of claim 3, wherein the organic light-emitting part includes a plurality of organic light-emitting parts, each of the plurality of light-emitting parts having a rectangular shape that has a first edge having a first length and a second edge having a second length, and wherein the first and second lengths are respectively in a range from about 5 cm to about 25 cm, and a distance between adjacent organic light-emitting parts is in a range from about 0.4 mm to about 0.6 mm.

5. The organic light-emitting substrate of claim 1, further comprising a light-blocking pattern formed along an outline of the unit pixel and which blocks light emitted by the light-emitting diode.

6. The organic light-emitting substrate of claim 5, wherein the light-blocking pattern includes a contact hole formed between the common electrode and the common voltage subsidiary line, wherein the common voltage subsidiary line and the common electrode are electrically connected therethrough.

7. The organic light-emitting substrate of claim 1, further comprising a common voltage outer line which applies a common voltage to the common voltage subsidiary line, wherein the common voltage outer line is disposed in the peripheral area and is electrically connected to the common voltage subsidiary line.

8. The organic light-emitting substrate of claim 7, further comprising a protective layer formed on the base substrate covering the driving circuit part, and wherein the organic light emitting diode is formed on the protective layer and is electrically connected to the driving circuit part through a pixel contact hole formed through the protective layer.

9. The organic light-emitting substrate of claim 8, wherein the common voltage outer line is formed between the protective layer and the base substrate, and the common voltage subsidiary line is formed on the protective layer and is electrically connected to the common voltage outer line through an outer line contact hole formed through the protective layer.

10. The organic light-emitting substrate of claim 1, wherein the common electrode includes a transparent conductive material, and the pixel electrode includes a reflective electrode which reflects light emitted by the organic light-emitting part.

11. The organic light-emitting substrate of claim 1, wherein the organic light-emitting part emits white light.

12. The organic light-emitting substrate of claim 11, wherein the organic light-emitting part includes a red light-emitting material which emits red light, a green light-emitting material which emits green light, and a blue light-emitting material which emits blue light.

13. The organic light-emitting substrate of claim 1, wherein the common voltage subsidiary line transmits a common electrode voltage and includes a material having lower electrical resistance than the common electrode.

14. An organic light-emitting display apparatus comprising:

an organic light-emitting substrate which emits light;

a opposite substrate facing the organic light-emitting substrate; and a sealing member enclosing a gap between the organic light-emitting substrate and the opposite substrate, wherein the organic light-emitting substrate comprises:

a base substrate including a display area and a peripheral area formed around the display area;

an organic light-emitting diode including a pixel electrode, a common electrode and an organic light-emitting part, the pixel electrode being formed in a unit pixel of the display area, the common electrode being formed over the display area, and the organic light-emitting part being disposed between the pixel electrode and the common electrode;

a driving circuit part which applies driving current to the pixel electrode and is electrically connected to the pixel electrode; and a common voltage subsidiary line formed on substantially the same layer as the pixel electrode, spaced apart from the pixel electrode, disposed under the common electrode, and electrically connected to the common electrode.

15. The organic light-emitting display apparatus of 14, wherein the organic light-emitting part emits white light, and the opposite substrate includes a color filter.

* * * * *